(12) United States Patent
Wu et al.

(10) Patent No.: US 11,367,636 B2
(45) Date of Patent: Jun. 21, 2022

(54) SUBSTRATE TRANSFER DEVICE, TRANSFER METHOD AND PHOTOLITHOGRAPHY APPARATUS

(71) Applicant: SHANGHAI MICRO ELECTRONICS EQUIPMENT (GROUP) CO., LTD., Shanghai (CN)

(72) Inventors: Fulong Wu, Shanghai (CN); Dong Ruan, Shanghai (CN)

(73) Assignee: Shanghai Micro Electronics Equipment (Group) Co., Ltd., Shanghai (CN)

( * ) Notice: Subject to any disclaimer, the term of this patent is extended or adjusted under 35 U.S.C. 154(b) by 722 days.

(21) Appl. No.: 16/155,441

(22) Filed: Oct. 9, 2018

(65) Prior Publication Data

US 2019/0109028 A1    Apr. 11, 2019

(30) Foreign Application Priority Data

Oct. 9, 2017 (CN) .......................... 201710931851.1

(51) Int. Cl.
*H01L 21/67* (2006.01)
*H01L 21/677* (2006.01)
(Continued)

(52) U.S. Cl.
CPC ...... *H01L 21/67236* (2013.01); *G03F 7/7075* (2013.01); *H01L 21/67173* (2013.01);
(Continued)

(58) Field of Classification Search
None
See application file for complete search history.

(56) References Cited

U.S. PATENT DOCUMENTS 6,486,444 B1 * 11/2002 Fairbairn .......... H01L 21/67196
118/50.1
7,042,553 B2 * 5/2006 An .......................... G03B 27/58
355/72
(Continued)

FOREIGN PATENT DOCUMENTS

CN    102819195 A    12/2012
CN    204019399 U    12/2014
(Continued)

*Primary Examiner* — Michael S Lowe
(74) *Attorney, Agent, or Firm* — Muncy, Geissler, Olds & Lowe, P.C.

(57) ABSTRACT

A substrate transfer device and method as well as a photolithography apparatus are disclosed. The device includes a motion platform and a plurality of transfer stages which are arranged side-by-side along a first direction are configured to transfer substrates in a second direction that is perpendicular to the first direction. The motion platform includes a base table and a plurality of motion tables in movable connection with the base table. Each of the transfer stages is connected to, and movable in the first direction with, a corresponding one of the motion tables. A pre-alignment assembly for pre-alignment and positional adjustments of the substrates is provided on the motion platform and on the transfer stages. When one of the transfer stages is unloading a first substrate, another one of the transfer stages receives a second substrate and effectuates its first- and second-directional pre-alignment with the aid of the pre-alignment assembly.

22 Claims, 7 Drawing Sheets

(51) Int. Cl.
*G03F 7/20* (2006.01)
*H01L 21/68* (2006.01)

(52) U.S. Cl.
CPC .. *H01L 21/67178* (2013.01); *H01L 21/67184* (2013.01); *H01L 21/67225* (2013.01); *H01L 21/67706* (2013.01); *H01L 21/67715* (2013.01); *H01L 21/67745* (2013.01); *H01L 21/67748* (2013.01); *H01L 21/67766* (2013.01); *H01L 21/68* (2013.01)

(56) References Cited

U.S. PATENT DOCUMENTS

| | | | | |
|---|---|---|---|---|
| 7,736,120 | B2* | 6/2010 | Pierson | B65G 57/24 |
| | | | | 414/792.6 |
| 8,834,582 | B2* | 9/2014 | Zhao | H01L 21/67017 |
| | | | | 29/25.01 |
| 10,857,674 | B2* | 12/2020 | Yokota | B23P 21/00 |
| 2001/0013515 | A1* | 8/2001 | Harada | H01L 21/67109 |
| | | | | 219/390 |
| 2005/0028928 | A1* | 2/2005 | Asa | H01L 21/6719 |
| | | | | 156/345.5 |
| 2014/0046471 | A1* | 2/2014 | Bamford | G05B 19/41815 |
| | | | | 700/110 |
| 2014/0199138 | A1 | 7/2014 | Van der Meulen et al. | |
| 2017/0062258 | A1 | 3/2017 | Bluck et al. | |

FOREIGN PATENT DOCUMENTS

| | | |
|---|---|---|
| CN | 104749895 A | 7/2015 |
| CN | 105425550 A | 3/2016 |
| CN | 106814551 A | 6/2017 |
| CN | 107285029 A | 10/2017 |
| JP | H-1172929 A | 3/1999 |
| JP | 2006179920 A | 7/2006 |
| JP | 2008175846 A | 7/2008 |
| JP | 2008191302 A | 8/2008 |
| JP | 2008243859 A | 10/2008 |
| JP | 2013003157 A | 1/2013 |
| JP | 2014067833 A | 4/2014 |

\* cited by examiner

SUBSTRATE TRANSFER DEVICE, TRANSFER METHOD AND PHOTOLITHOGRAPHY APPARATUS

CROSS-REFERENCE TO RELATED APPLICATIONS

This application claims the priority of Chinese patent application number 201710931851.1, filed on Oct. 9, 2017, the entire contents of which are incorporated herein by reference.

TECHNICAL FIELD

The present invention relates to the field of photolithography and, in particular, to a substrate transfer device, transfer method and a photolithography apparatus.

BACKGROUND

In many semiconductor devices such as photolithography machines, a substrate needs to be handed over onto and transferred by a transfer device before an exposure process is conducted. The substrate is generally handed over at a transfer position of the transfer device and further transferred to an exposure position for conducting the exposure process. However, such a transfer device is typically incapable of substrate pre-alignment which is required prior to final substrate exposure conducted on a workpiece stage. Thus, use of a separate pre-alignment device is necessary, which leads to low substrate exposure efficiency.

SUMMARY OF THE INVENTION

It is an objective of the present invention to address the above low substrate exposure efficiency problem by presenting a substrate transfer device and method as well as a photolithography apparatus.

To this end, a substrate transfer device provided in the present invention includes a motion platform and a plurality of transfer stages, the plurality of transfer stages are arranged along a first direction and are configured to transfer substrates in a second direction that is perpendicular to the first direction, the motion platform includes a base table and a plurality of motion tables in movable connection with the base table, wherein each of the plurality of transfer stages is connected to, and movable in the first direction with, a corresponding one of the plurality of motion tables, wherein a pre-alignment assembly for pre-alignment and positional adjustments of the substrates is provided on the motion platform and on the plurality of transfer stages, and wherein when one of the plurality of transfer stages unloads a first substrate, another one of the plurality of transfer stages simultaneously receives a second substrate and the second substrate is subject to a pre-alignment in the first and second directions using the corresponding pre-alignment assembly.

Additionally, the pre-alignment assembly may include first-directional pre-alignment elements arranged on both sides of the plurality of transfer stages and are configured for first-directional pre-alignment and positional adjustments of the substrates on the plurality of transfer stages.

Additionally, the pre-alignment assembly may further include second-directional pre-alignment elements arranged on the base table and are configured for second-directional pre-alignment and positional adjustments of the substrates on the plurality of transfer stages.

Additionally, the plurality of transfer stages may include at least one loading stage and at least one unloading stage.

Additionally, each of the transfer stages may be provided with a transfer assembly configured to transfer a substrate from the loading stage onto a workpiece stage or transfer a substrate that has been exposed from the workpiece stage onto the unloading stage.

Additionally, the base table may define a substrate handover position where a substrate is handed over onto the transfer stage, wherein the pre-alignment assembly further includes two second-directional pre-alignment elements located on both sides of the substrate handover position.

Additionally, the substrate handover position may include a substrate loader fork handover position and a workpiece stage handover position which are distributed on both sides of the base table along the second direction, wherein the transfer stage is configured to receive a substrate from a substrate loader fork at the substrate loader fork handover position, and wherein the transfer stage is configured to hand over the substrate onto the workpiece stage at the workpiece stage handover position.

Additionally, the motion table to which the loading stage is connected and the motion table to which the unloading stage is connected may be a single integral member.

Additionally, the two second-directional pre-alignment elements may be located respectively at an unloading pre-alignment position and a loading pre-alignment position, the unloading pre-alignment position and the loading pre-alignment position being distributed on both sides of the substrate handover position in symmetry with each other along the first direction, and wherein when the unloading stage is located at the substrate handover position, the loading stage is located at the loading pre-alignment position, and wherein when the loading stage is located at the substrate handover position, the unloading stage is located at the unloading pre-alignment position.

Additionally, the base table may be provided with a transition air suspension assembly configured to provide an air suspension support to a substrate located between the workpiece stage and the transfer stage.

Additionally, the transition air suspension assembly may be provided with a lifting member that is configured to lift the transition air suspension assembly and is connected to the base table.

Additionally, the base table may be provided with a static eliminator configured to eliminate static electricity from a substrate that is being handed over from the substrate loader fork to the loading stage.

Additionally, the base table may be provided with a safety detection member configured for positional detection of the substrate loader fork for substrate pickup and placement.

Additionally, the base table may be provided with an air-bath unit configured to adjust a temperature of a substrate carried on the loading stage.

Additionally, the transfer stages may include conveyance roller assemblies and universal adjustment assemblies, the conveyance roller assemblies configured to move a substrate in the second direction, the universal adjustment assemblies adapted to raise the substrate in a third direction and allow first- and/or second-directional position adjustments of the raised substrate, the third direction being perpendicular to a plane defined by the first and second directions.

A substrate transfer method using the substrate transfer device as defined above includes a substrate unloading step for transferring a substrate from a workpiece stage onto an unloading stage, the substrate unloading step including:

S11) movement of the unloading stage to a substrate handover position;

S12) transfer of a first substrate that has been exposed from the workpiece stage to the unloading stage by a transfer assembly on the unloading stage;

S13) release of the first substrate by the transfer assembly on the unloading stage and first-directional orientation adjustments of the first substrate on the unloading stage using first-directional pre-alignment elements on the unloading stage;

S14) retention of the first substrate by the transfer assembly on the unloading stage, movement of the unloading stage with a motion table to an unloading pre-alignment position, release of the first substrate by the transfer assembly on the unloading stage, second-directional orientation adjustments of the first substrate on the unloading stage using second-directional pre-alignment elements, and retention of the first substrate by the transfer assembly on the unloading stage, wherein a direction of the first-directional orientation adjustments is perpendicular to a direction of the second-directional orientation adjustments; and S15) movement of the unloading stage to a substrate loader fork handover position, release of the first substrate by the transfer assembly on the unloading stage, and pickup of the first substrate by a substrate loader fork.

Additionally, the substrate transfer method may further include S16) returning the transfer assembly on the unloading stage to an original position for a next unloading cycle.

Additionally, the substrate transfer method may further include a substrate loading step for transferring a substrate from a loading stage to the workpiece stage, the substrate loading step including:

S21) movement of the loading stage to the substrate loader fork handover position and placement of a second substrate onto the loading stage by the substrate loader fork;

S22) first-directional orientation adjustments of the second substrate on the loading stage using the first-directional pre-alignment elements on the loading stage;

S23) retention of the second substrate by the transfer assembly on the loading stage, movement of the loading stage with the motion table to a loading pre-alignment position, release of the second substrate by the transfer assembly on the loading stage, and second-directional orientation adjustments of the second substrate on the loading stage with using the second-directional pre-alignment elements; and S24) retention of the second substrate by the transfer assembly on the loading stage, movement of the second substrate with the motion table to a workpiece stage handover position, and transfer of the second substrate onto the workpiece stage by the transfer assembly on the loading stage.

Additionally, the substrate transfer method may further include S25) returning the transfer assembly on the loading stage to an original position for a next loading cycle.

Additionally, in S12, prior to the transfer of the first substrate onto the unloading stage, the transition air suspension assembly may be lifted by a lifting member so as to provide an air suspension support to the first substrate, and after the first substrate has been transferred onto the unloading stage, the transition air suspension assembly is lowered.

Additionally, in S21, during the transfer of the second substrate by the substrate loader fork, a static eliminator may eliminate static electricity from the second substrate.

Additionally, in S21, during the transfer of the second substrate by the substrate loader fork, a safety detection member may detect whether the substrate loader fork is located to interfere with the substrate handover position.

Additionally, in S23, after completion of the second-directional orientation adjustments of the second substrate, an air-bath unit adjusts a temperature of the second substrate to an ambient temperature for exposure.

Additionally, during the first- or second-directional orientation adjustments of the first or second substrate, universal adjustment assemblies on the unloading or loading stage raise the first or second substrate along a third direction that is perpendicular to a plane defined by the first and second directions.

A photolithography apparatus includes a workpiece stage and the substrate transfer device as defined above, in which a plurality of transfer stages for transferring substrates in a second direction includes at least one loading stage and at least one unloading stage, the loading stage configured to transfer a substrate to be exposed onto a workpiece stage, the unloading stage configured to receive from the workpiece stage a substrate that has been exposed.

Compared with the prior art, in the substrate transfer device and method and the photolithography apparatus of the present invention, during substrate processing, while one of the transfer stages is unloading a processed substrate from the workpiece stage, another one of the transfer stages receives a new substrate from the substrate loader fork. The substrate is then subjected to X-directional orientation pre-alignment with the aid of the X-directional pre-alignment elements on the transfer stage and Y-directional pre-alignment with the aid of the Y-directional pre-alignment elements. After the transfer stage carrying the processed substrate moves away, the transfer stage carrying the new substrate approaches the workpiece stage and transfers, by means of the transfer assembly thereon, the new substrate onto the workpiece stage for processing. During this process, concurrently with the unloading of the process substrate, the new substrate is being prepared for loading. In this way, after the processed substrate is taken away, the new substrate can be loaded onto the workpiece stage in a significantly shorter time. As a result, the processing efficiency can be improved. During the movement of the transfer stage carrying the new substrate toward the workpiece stage, the processed substrate experiences X-directional pre-alignment with the aid of the X-directional pre-alignment elements on the transfer stage on which the processed substrate is carried and Y-directional pre-alignment with the aid of the Y-directional pre-alignment element. The alignment facilitates the subsequent placement of the processed substrate after the substrate loader fork takes it away. Thus, high practicality is achievable. Throughout the whole substrate handling process, the placement of the new substrate is conducted concurrently with the removal of the processed substrate. Therefore, high processing efficiency is ensured. Moreover, the processed substrate experiences precise positional adjustment before it is taken away, allowing it to be placed subsequently in a better and safer way.

In these figures, 1—motion platform; 101—base table; 102—motion table; 1021—motion frame; 1022—loading Y-directional guideway; 1023—unloading Y-directional guideway; 2—X-directional pre-alignment element; 201—bracket; 202—X-directional air slide table; 203—mounting plate; 204—vertical pillar; 205—antistatic roller; 3—Y-directional pre-alignment element; 301—unloading Y-directional pre-alignment position; 302—loading Y-directional pre-alignment position; 4—transfer assembly; 401—mounting bracket; 402—suction cup assembly; 5—workpiece stage; 6—loading stage; 7—unloading stage; 8—substrate handover position; 801—substrate loader fork handover position; 802—workpiece stage handover position; 9—transition air suspension assembly; 10—lifting member; 11—static eliminator; 12—safety detection member; 13—air-bath unit; 14—connecting frame; 15—Y-directional conveyance roller assembly; 1501—baseplate; 1502—antistatic conveyance roller; 16—universal adjustment assembly; 17—adjustment cylinder; 18—universal bead; 19—air suspension block.

DETAILED DESCRIPTION OF EXEMPLARY EMBODIMENTS

The substrate transfer device and method and the photolithography apparatus proposed in the present invention will be described in greater detail with reference to a few specific embodiments which are to be read in conjunction with the accompanying drawings. Features and advantages of the invention will be more apparent from the following detailed description, and from the appended claims. Note that the accompanying drawings are provided in a very simplified form not necessarily presented to scale, with the only intention of facilitating convenience and clarity in explaining the several embodiments of the invention. Throughout the figures, identical or similar elements are given the same or analogous reference numbers.

Figure 1:
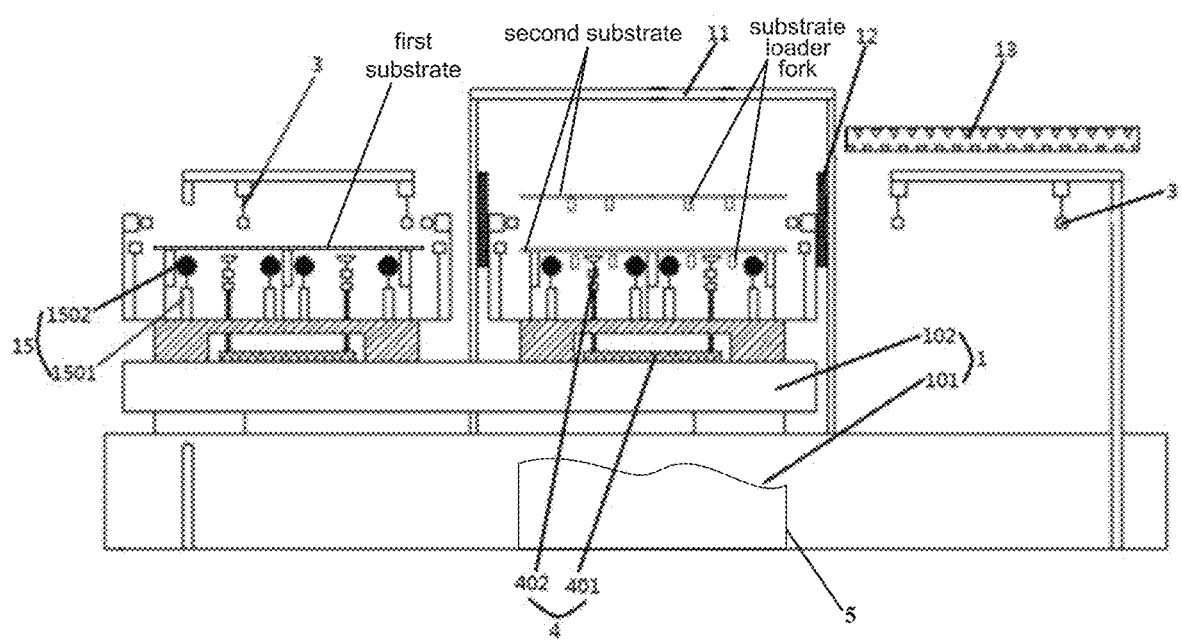
FIG. 1 is a schematic front view of a substrate transfer device of the present invention.
Figure 2:
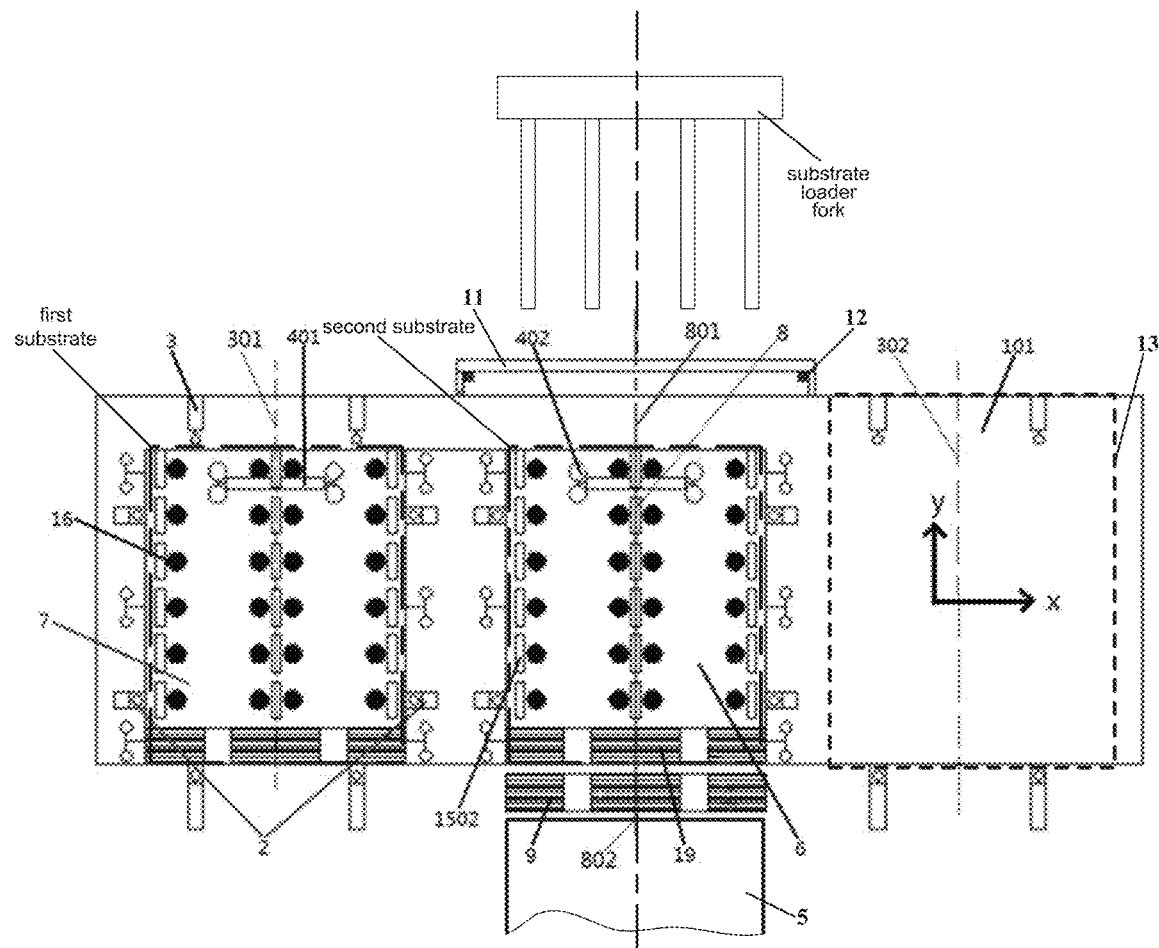
FIG. 2 is a schematic top view of a substrate transfer device of the present invention.

A substrate transfer device, as shown in FIGS. 1 to 10, includes a motion platform 1 and a plurality of transfer stages which are arranged side-by-side along the X direction and are configured to transfer substrates along the Y direction that is perpendicular to the X direction. The X and Y directions are illustrated in FIG. 2. The motion platform 1 includes a base table 101 and a plurality of motion tables 102 in movable connection with the base table 101. The transfer stages are connected to, and movable in the X direction with, the respective motion tables 102. The plurality of transfer stages include a plurality of loading stages 6 and a plurality of unloading stages 7. Preferably, it is configured that a substrate experiences alignment or focal plane measurements, exposure and the like while being carried on a workpiece stage 5 for use in a photolithography machine.

Preferably, the base table 101 and the motion tables 102 are all frame structures.

Preferably, a pre-alignment assembly for pre-alignment and positional adjustments of the substrate is disposed on the motion platform 1 and/or on the transfer stages. Preferably, the pre-alignment assembly includes: X-directional pre-alignment elements 2 that are disposed on both sides of the transfer stages along the X direction and configured for X-directional pre-alignment and positional adjustments of substrates on the transfer stages; and Y-directional pre-alignment elements 3 that are disposed on the base table 101 and configured for Y-directional pre-alignment and positional adjustments of substrates on the transfer stages.

Preferably, each of the transfer stages is provided with a transfer assembly 4 configured to, if the transfer stage is a loading stage 6, transfer a substrate from the loading stage 6 to the workpiece stage 5, and if the transfer stage is an unloading stage 7, transfer a processed substrate from the workpiece stage 5 to the unloading stage 7. Preferably, the plurality of transfer stages includes one loading stage 6 and one unloading stage 7.

Preferably, the base table 101 has substrate handover position 8. Herein, the substrate handover position refers to the position where substrates are handed over by the transfer stages. Additionally, the number of the Y-directional pre-alignment elements 3 on the base table 101 is two, and the two Y-directional pre-alignment elements 3 are arranged side-by-side along the X direction so that they are located on opposing sides of the substrate handover position 8. Preferably, the substrate handover position 8 includes a handover position 801 for a substrate loader fork and a handover position 802 for the workpiece stage. The handover positions 801, 802 are located on opposing sides of the base table 101 along the Y direction. The handover position 801 is a position for substrate handover between the substrate loader fork and the transfer stages, while the handover position 802 is a position for substrate handover between the workpiece stage 5 and the transfer stages.

Preferably, the motion table 102 connected to the loading stage 6 and the motion table 102 connected to the unloading stage 7 are a single integral member. That is, the motion table 102 is configured to drive synchronous movement of the loading and unloading stages 6, 7. Preferably, the two Y-directional pre-alignment elements 3 are respectively disposed at an unloading Y-directional pre-alignment position 301, where pre-alignment and positional adjustments of the unloading stage 7 along the Y direction are effectuated, and a loading Y-directional pre-alignment position 302 where pre-alignment and positional adjustments of the loading stage 6 along the Y direction are effectuated. The unloading and loading Y-directional pre-alignment positions 301, 302 are aligned along the X direction in symmetry with respect to the substrate handover position 8. During synchronous movement of the motion tables 102, when the unloading stage 7 is located at one of the substrate handover position 8, the loading stage 6 is located at the loading Y-directional pre-alignment position 302; and when the loading stage 6 is located at one of the substrate handover position 8, the unloading stage 7 is located at the unloading Y-directional pre-alignment position 301.

Preferably, the base table 101 is provided with a transition air suspension assembly 9 configured to provide an air suspension support to a substrate situated between the workpiece stage 5 and the transfer stages. Preferably, the transition air suspension assembly 9 is connected to a lifting member 10 for lifting the transition air suspension assembly 9. The lifting member 10 is connected to the base table 101.

Figure 3:
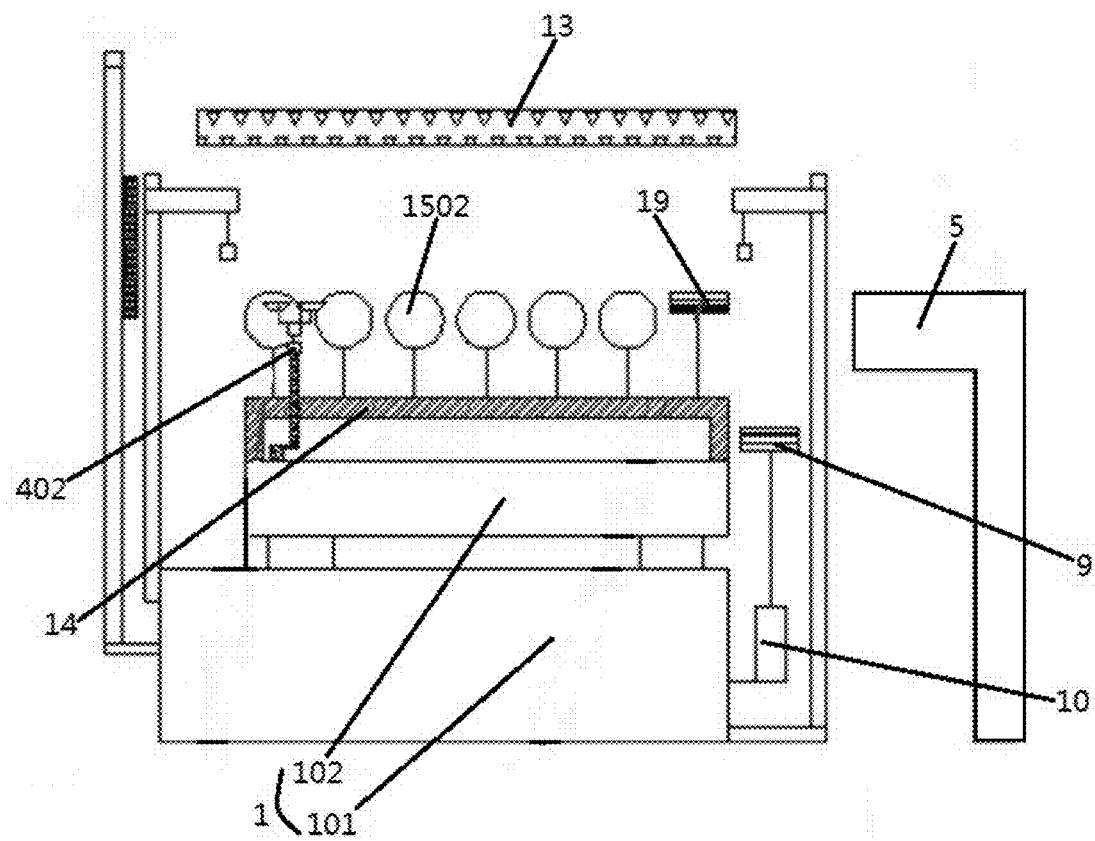
FIG. 3 is a schematic side view of a substrate transfer device of the present invention.

Preferably, the base table 101 is provided with a static eliminator 11 configured to eliminate static electricity from a substrate that is being handed over from the substrate loader fork to the loading stage 6. Preferably, the base table 101 is provided with a safety detection member 12 configured for positional detection of the substrate loader fork for substrate pickup and placement. Preferably, the base table 101 is also provided with an air-bath unit 13 for adjusting the temperature of a substrate carried on the loading stage 6. Specifically, the air-bath unit 13 shown in FIGS. 1, 3 is configured to adjust the temperature of the second substrate to the ambient temperature of the exposure environment, belonging to the common knowledge in the art, detailed description is omitted here.

Preferably, the transfer stages include Y-directional conveyance roller assemblies and universal adjustment assemblies 16. The Y-directional conveyance roller assemblies are configured to enable Y-directional movement of a substrate, and the universal adjustment assemblies 16 are adapted to raise the substrate along a Z direction and allow positional adjustments of the raise substrate in the X direction and/or the Y direction. The Z direction is perpendicular to a plane defined by the X and Y directions.

A substrate transfer method includes a substrate unloading step for substrate transfer from the workpiece stage 5 to the unloading stage 7. The substrate unloading step includes:

S11) movement of the unloading stage 7 to the handover position 802;

S12) movement of the transfer assembly 4 on the unloading stage 7 and transfer of a first substrate that has been processed from the workpiece stage 5 to the unloading stage 7 by the transfer assembly 4, wherein during the transfer, the transfer assembly 4 retains the substrate, for example, by suction, and after the first substrate has been transferred to a target site on the unloading stage 7, the retention of the first substrate by the transfer assembly 4 is released;

S13) activation of the X-directional pre-alignment elements 2 on the unloading stage 7, which then effect X-directional orientation and position adjustments of the first substrate on the unloading stage 7, and subsequent to the completion of X-directional position adjustments of the unloading stage 7, retention of the first substrate by the transfer assembly 4, for example, by suction;

S14) movement of the unloading stage 7 with the motion tables 102 to the unloading Y-directional pre-alignment position 301 where the retention of the first substrate by the transfer assembly 4 on the unloading stage 7 is released, activation of the Y-directional pre-alignment elements 3 which then effect Y-directional orientation and position adjustments of the first substrate on the unloading stage 7, and subsequent to the completion of Y-directional position adjustments of the unloading stage 7, retention of the first substrate by the transfer assembly 4, wherein the Y direction is perpendicular to the X direction;

S15) movement of the unloading stage 7 to the handover position 801, release of the first substrate from the transfer assembly 4 on the unloading stage 7, and pickup of the first substrate by the substrate loader fork; and S16) returning of the transfer assembly 4 on the unloading stage 7 to the original position and preparation thereof for the next unloading cycle.

The substrate transfer method further includes a substrate loading step for substrate transfer from the loading stage 6 onto the workpiece stage 5. The substrate loading step includes:

S21) movement of the loading stage 6 to the handover position 801 and transfer and placement of a second substrate from the substrate loader fork onto the loading stage 6;

S22) activation of the X-directional pre-alignment elements 2 on the loading stage 6, which then effect X-directional orientation and position adjustments of the second substrate on the loading stage 6, and subsequent to the completion of X-directional position adjustments of the loading stage 6, retention of the second substrate by the transfer assembly 4, for example, by suction;

S23) movement of the loading stage 6 with the motion tables 102 to the loading Y-directional pre-alignment position 302 where the retention of the second substrate by the transfer assembly 4 on the loading stage 6 is released, activation of the Y-directional pre-alignment elements 3 which then effect Y-directional orientation and position adjustments of the second substrate on the loading stage 6, and subsequent to the completion of Y-directional position adjustments of the loading stage 6, retention of the second substrate by the transfer assembly 4;

S24) transfer of the second substrate to the handover position 802 by the motion table 102 and further transfer of the second substrate to the workpiece stage 5 by the transfer assembly 4 on the loading stage 6; and S25) returning of the transfer assembly 4 on the loading stage 6 to the original position and preparation thereof for the next loading cycle.

Preferably, in S12, prior to the transfer of the first substrate onto the unloading stage 7, the transition air suspension assembly 9 is lifted by the lifting member 10 so as to provide an air suspension support to the first substrate. After the first substrate has been transferred onto the unloading stage 7, the transition air suspension assembly 9 is caused to be lowered. Preferably, in S21, during the transfer of the second substrate by the substrate loader fork, the static eliminator 11 eliminates static electricity from the second substrate. Preferably, in S21, during the transfer of the second substrate by the substrate loader fork, the safety detection member 12 detects whether the substrate loader fork is located to interfere with the substrate handover position 8, which may give rise to a collision.

Preferably, in S23, after the completion of the Y-directional orientation adjustments of the second substrate, the air-bath unit 13 adjusts the temperature of the second substrate to the ambient temperature of the exposure environment. Preferably, during the X- or Y-directional orientation adjustments of the first or second substrate, the universal adjustment assemblies 16 on the unloading 7 or loading stage 6 are configured to raise the first or second substrate along the Z direction and allows positional adjustments of the raised substrate in the X direction and/or the Y direction. The Z direction is perpendicular to the plane defined by the X and Y directions.

The present invention also provides a photolithography apparatus including the workpiece stage 5 and the substrate transfer device as defined above. The plurality of transfer stages for transferring substrates in the Y direction includes: a plurality of loading stages 6, each configured to transfer a substrate to be exposed onto the workpiece stage 5; and a plurality of unloading stage 7, each configured to receive an exposed substrate from the workpiece stage 5.

The present invention also provides a photolithography method using the substrate transfer method as defined above.

In summary, in the substrate transfer device and method and photolithography apparatus and method of the present invention, since the loading and unloading stages 6, 7 are connected to the same motion table 102, and because the Y-directional pre-alignment elements 3, i.e., the loading Y-directional pre-alignment positions 302 and the unloading Y-directional pre-alignment positions 301, are distributed in symmetry with respect to the substrate handover position 8, the whole process is as follows.

When the unloading stage 7 receives from the workpiece stage 5 a first substrate that has been processed, a second substrate on the loading stage 6 that has experienced X-directional pre-alignment is located at the loading Y-directional pre-alignment position 302 on the base table 101, where the second substrate is supported by the universal adjustment assemblies 16 and is adjusted to a preset position in the Y direction with the aid of the Y-directional pre-alignment elements 3 on the two Y-directional sides of the second substrate. In this manner, Y-directional placement of the second substrate is completed.

On the unloading stage 7, the first substrate is raised by the universal adjustment assemblies 16, followed by X-directional pre-alignment and positional adjustments of the first substrate with the aid of the X-directional pre-alignment elements 2 on the unloading stage 7. The motion table 102 then moves the unloading stage 7 to the unloading Y-directional pre-alignment position 301, and at the same time, the loading stage 6 is moved to handover position 801.

At the unloading Y-directional pre-alignment position 301, the first substrate is subjected to Y-directional pre-alignment and positional adjustments while it is being supported by the universal adjustment assemblies 16, followed by transfer of the second substrate whose positional adjustments have been completed onto the workpiece stage.

The substrate loader fork places a new substrate on the loading stage 6 as another second substrate, and X-directional pre-alignment and positional adjustments of this new second substrate are effected with the aid of the X-directional pre-alignment elements 2 disposed at the opposing edges of the loading stage 6.

The motion table 102 moves again to carry the unloading stage 7 on which the first substrate is supported to the handover position 801, where the substrate loader fork takes the first substrate away from the unloading stage 7. At this point, the new second substrate is located at the loading Y-directional pre-alignment position 302, where Y-directional pre-alignment of the new second substrate is effected with the aid of the Y-directional pre-alignment elements 3. As a result, Y-directional placement of the new second substrate is achieved.

After the first substrate is taken away, the unloading stage 7 gets ready for receiving from the workpiece stage a new first substrate that has been processed.

This cyclic parallel approach allows orientational alignment of a substrate to be exposed to be simultaneously conducted with the unloading of a substrate that has been processed, resulting in remarkable savings in processing time and enhanced processing efficiency. Moreover, the processed substrate is adjusted to a preset position on the unloading stage 7 before it is taken away by the substrate loader fork so that the subsequent placement of the substrate by the substrate loader fork can be easier and safer, allowing higher practicality.

As the loading and unloading stages 6, 7 are connected to the same motion table 102 and the two Y-directional pre-alignment elements 3 are arranged in symmetry with respect to the substrate handover position 8, the cost can be reduced, and the loading and unloading stages 6, 7 can be controlled to move in synchronization with fewer errors.

Before the exposed substrate is transferred from the workpiece stage onto the unloading stage 7, the lifting member 10 lifts the transition air suspension assembly 9 so that it can provide the substrate with a transition support between the workpiece stage 5 and the unloading stage 7. This enables a better support with a higher factor of safety, in particular for large substrates, which can prevent the occurrence of cracks of the substrates or the like. Therefore, the subject matter of the present invention is applicable to the transfer of large-size substrates. While a substrate is pulled forward by the transfer assembly 4, it is supported on top of the Y-directional conveyance roller assemblies 15, which can prevent the occurrence of cracks and minimize the wear of the substrates. After the exposed substrate has been transferred to the unloading stage 7, the lifting member 10 lowers the transition air suspension assembly 9 so that when the workpiece stage 5 carries a new substrate and approaches the motion platform 1, it will not bump into the transition air suspension assembly 9, achieving improved safety.

The static eliminator 11 and the safety detection member are disposed on the base table 101 at the handover position 801 which is midway of the substrate transfer path of the substrate loader fork. Therefore, every substrate is subjected to static elimination before it is exposed, thereby immunizing the subsequent exposure from any possible influence introduced by static electricity. Additionally, the safety detection member 12 detects, as appropriate, whether the substrate loader fork is located to interfere with the substrate handover position 8. This can avoid subsequent substrate transfer with a positional deviation in the substrate loader fork and ensures good substrate transfer reliability. The air-bath unit 13 disposed at the loading Y-directional pre-alignment position 302 can maintain the temperature of the pre-aligned second substrate that is waiting for delivery by the loading stage 6 for exposure in consistency with the ambient temperature of the exposure environment, thereby avoiding exposure quality from suffering from a difference between the substrate and ambient temperatures and making an indirect contribution to exposure quality.

Therefore, the photolithography apparatus using the above-described transfer substrate device and method allows higher substrate transfer efficiency, higher safety in subsequent substrate placement, improved exposure quality and good practicality.

Figure 4:
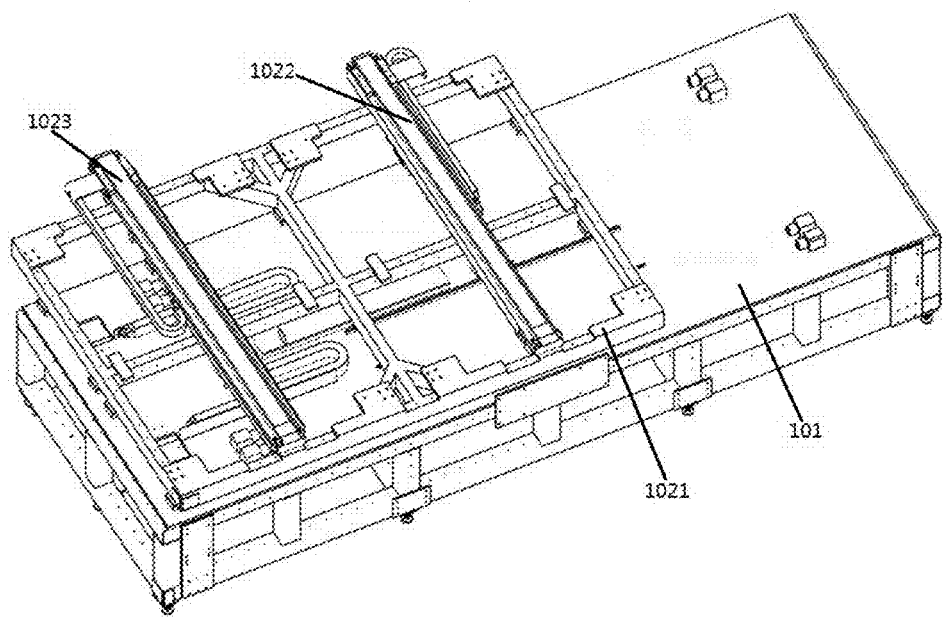
FIG. 4 is a structural schematic of a motion platform according to the present invention.

FIG. 4 illustrates the structure of the motion platform 1. As shown, the motion table 102 includes a motion frame 1021, and further includes a loading Y-directional guideway 1022 and an unloading Y-directional guideway 1023, each of which are connected in parallel to the motion frame 1021. The loading stage 6 is connected to the loading Y-directional guideway 1022 and the unloading stage 7 to the unloading Y-directional guideway 1023. The motion frame 1021 is able to move, as a whole, in the X direction on the base table 101 to cause X-directional movement of the loading and unloading stages 6, 7. Disposed between the motion frame 1021 and the base table 101 is a locking cylinder for immobilizing the motion frame 1021 relative to the base table 101 during loading, unloading and substrate position adjustment operations. This can ensure positional stability of the substrate which is favorable to the loading and unloading operations and X- and Y-direction substrate orientation adjustments.

Figure 5:
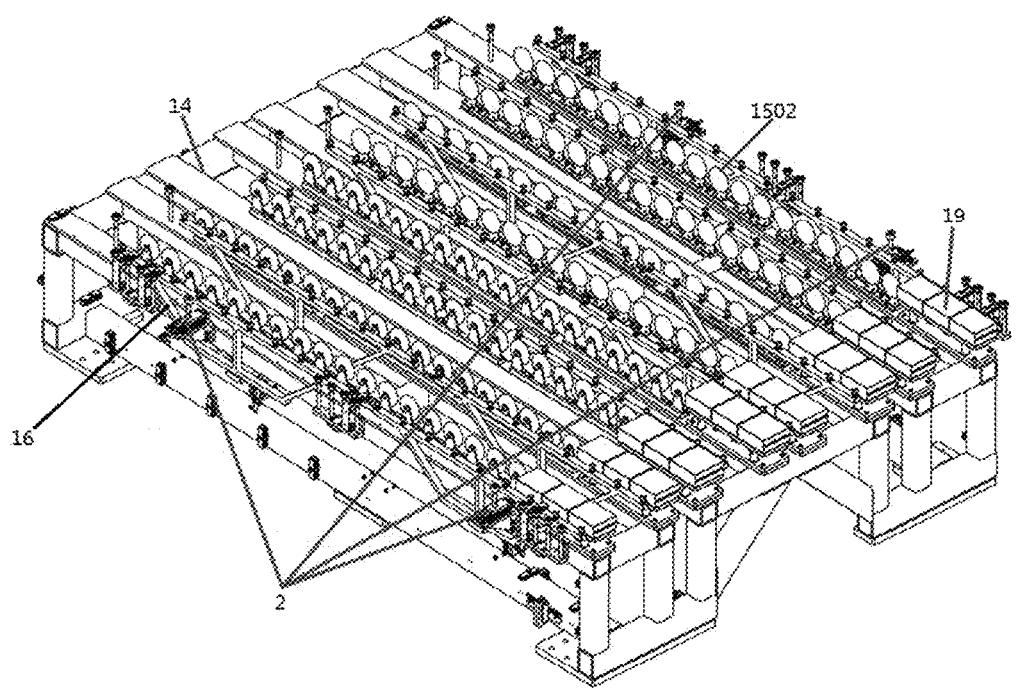
FIG. 5 is a structural schematic of a transfer stage (loading or unloading stage) according to the present invention.
Figure 6:
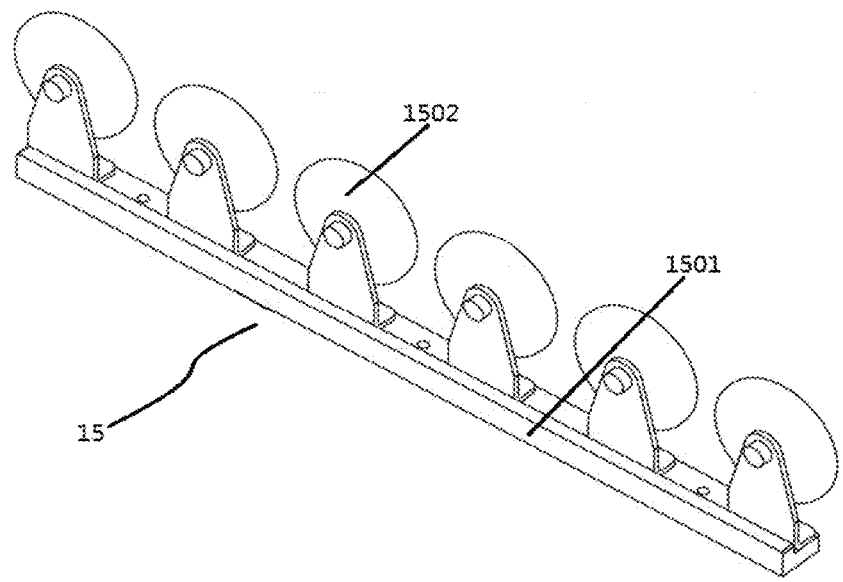
FIG. 6 is a structural schematic of a Y-directional conveyance roller assembly according to the present invention.
Figure 7:
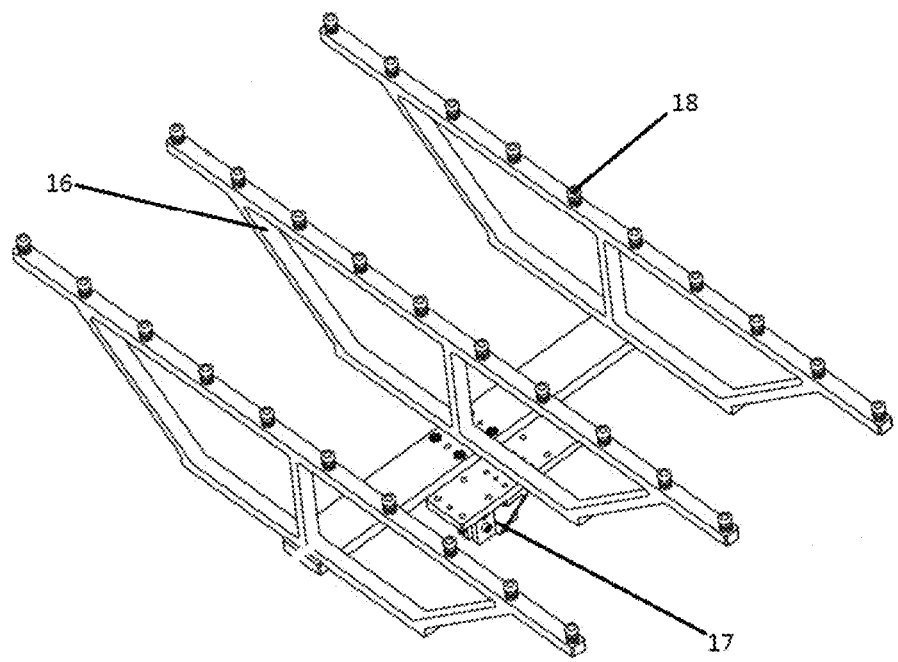
FIG. 7 schematically illustrates universal adjustment assemblies, an adjustment cylinder and universal beads according to the present invention.

As shown in FIG. 5, each transfer stage includes: a connecting frame 14 that is connected to the motion table 102; and the plurality of parallel Y-directional conveyance roller assemblies 15 surrounded by the connecting frame 14. As shown in FIG. 6, each of the Y-directional conveyance roller assemblies 15 includes: a baseplate 1501 that is attached to the connecting frame 14; and anti-static conveyance rollers 1502 that are rotatably mounted on the baseplate 1501. When a substrate is supported on the Y-directional conveyance roller assemblies 15, the substrate can only move in the Y direction. The universal adjustment assemblies 16 are connected to the connecting frame 14 and are connected to the motion table 102 through adjustment cylinders 17 so that they are moveable up and down in the Z direction that is perpendicular to the plane defined by the X and Y directions. In order to adjust the position of a substrate in the X direction, the adjustment cylinders 17 lifts the universal adjustment assemblies 16 and the universal adjustment assemblies 16 then raise the substrate at their apical universal beads 18 so that the substrate is allowed to be moved in the X and Y directions as required for the pre-alignment thereof. The universal adjustment assemblies 16, the adjustment cylinders 17 and the universal beads 18 are shown in FIG. 7. The "universal bead" is also known as the universal ball, because the rolling of the universal ball is flexible, so that the workpiece, the objects, which can greatly reduce the labor intensity of workers, belonging to the common knowledge in the art, detailed description is omitted here. Subsequent to the positional adjustments of the substrate, the adjustment cylinders 17 move down so that the substrate is supported on the Y-directional conveyance roller assemblies 15. At the end of the transfer stage proximal to the workpiece stage 5 is provided a front-end air-suspension block 19 (FIG. 10) for providing the substrate with a transition support.

Figure 8:
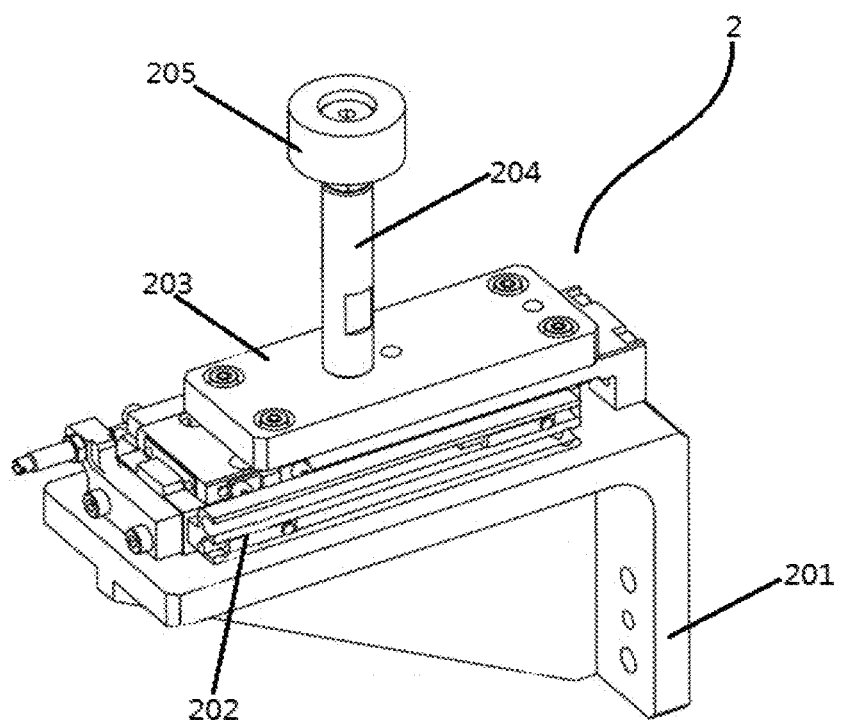
FIG. 8 is a structural schematic of an X-directional pre-alignment element according to the present invention.

FIG. 8 illustrates one of the X-directional pre-alignment elements 2. As shown, it includes: a bracket 201 connected to the connecting frame 14; an X-directional air slide table 202 coupled to the bracket 201; and a mounting plate 203, vertical pillar 204 and an antistatic roller 205, each disposed on the X-directional air slide table 202. The X-directional air slide table 202 is able to actuate the mounting plate 203, the vertical pillar 204 and the antistatic roller 205 and to cause X-direction movement of a substrate. Along the X direction, there are two X-directional pre-alignment elements 2 on each side of the transfer stage, and the four X-directional pre-alignment elements 2 can work together to effect precise X-directional position adjustments of the substrate. Each of the Y-directional pre-alignment elements 3 includes two pairs of cylinders disposed on the respective sides of the base table 101 along the Y direction. After the substrate is lifted by the universal adjustment assemblies 16, the Y-directional pre-alignment elements 3 can move to clamp the substrate at its opposite sides along the Y direction and effectuate its Y-directional position adjustments.

Figure 9:
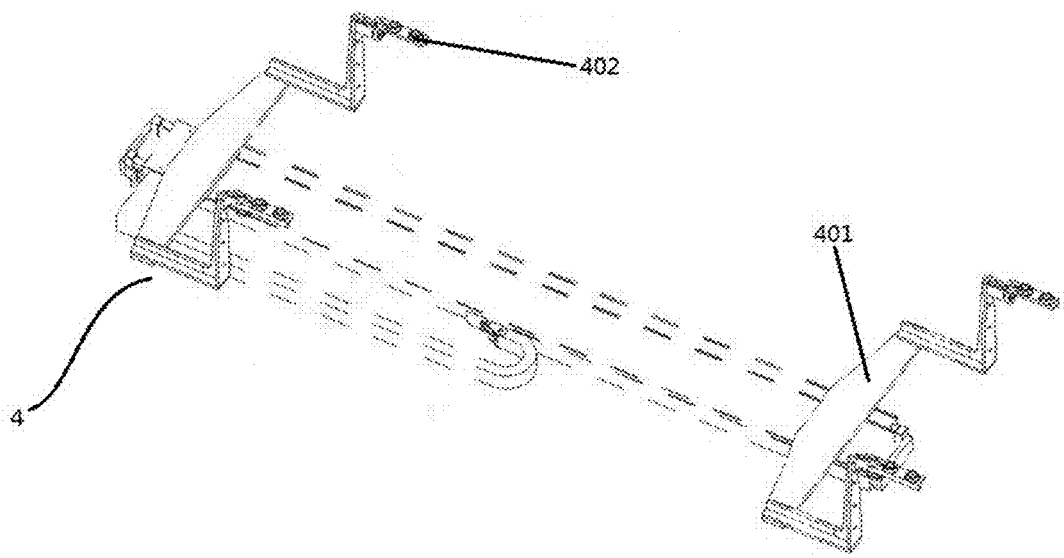
FIG. 9 is a structural schematic of a transfer assembly according to the present invention.
Figure 10:
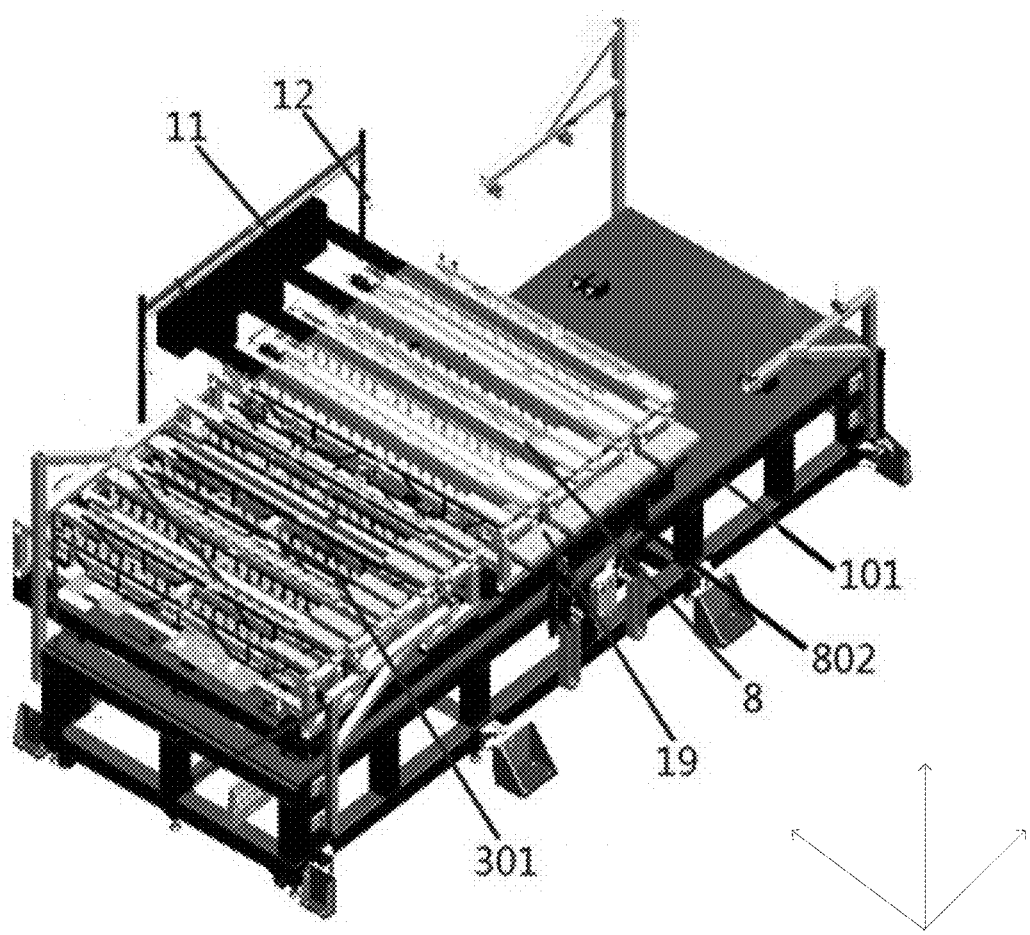
FIG. 10 is a three-dimensional view showing a motion platform according to the present invention.

As shown in FIG. 9, the transfer assembly 4 includes: mounting brackets 401 in movable connection with the motion table 102; and suction cup assemblies 402 on the mounting brackets 401. The mounting brackets 401 are connected to the motion table 102 via cylinders so that they are able to move up and down. In order to transfer a substrate, the mounting brackets 401 of the transfer assembly 4 move to cause the suction cup assemblies 402 to be located under the substrate. The suction cups of the suction cup assemblies 402 then create a vacuum by which the substrate is retained and movable with the mounting brackets 401. In the same way, the substrate is also retained by the suction cup assemblies 402 during movement of the transfer stage. However, during X- or Y-directional orientation adjustments of the substrate, the suction cup assemblies 402 are deactivated to allow free movement of the substrate. All the cylinders involved in the present invention may be replaced with motors or other actuating devices.

Figure 11:
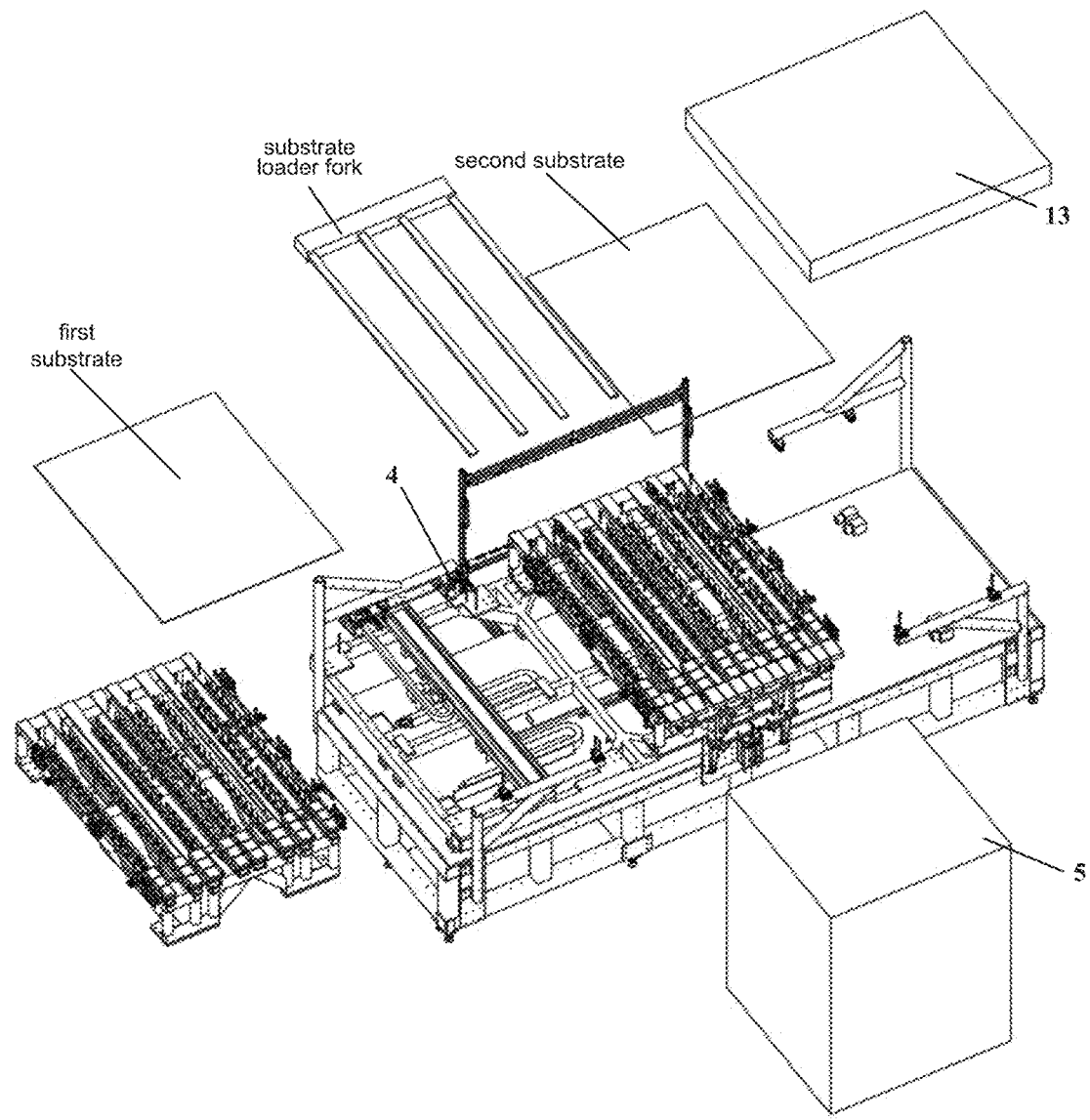
FIG. 11 is an exploded view of FIG. 10.
Figure 12:
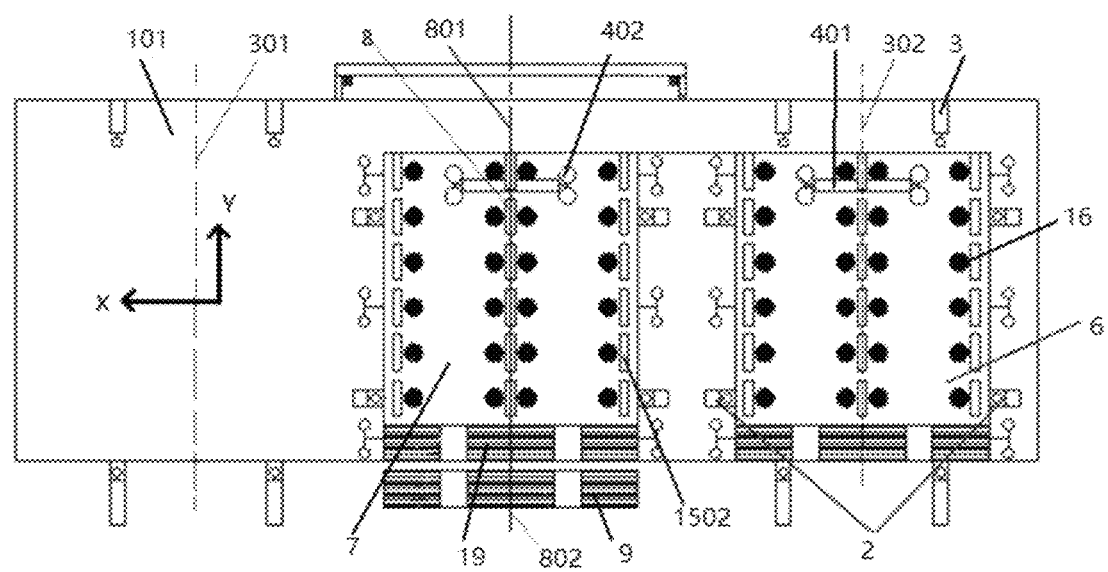
FIG. 12 is another schematic top view of a substrate transfer device of the present invention.

As shown in FIGS. 11-12, the fully operational substrate transfer device comprises movement of the transfer assembly 4 on the unloading stage 7 and transfer of a first substrate that has been processed from the workpiece stage 5 to the unloading stage 7 by the transfer assembly 4, activation of the X-directional pre-alignment elements 2 on the unloading stage 7; movement of the unloading stage 7 with the motion tables 102 to the unloading Y-directional pre-alignment position 301 where the retention of the first substrate by the transfer assembly 4 on the unloading stage 7 is released, activation of the Y-directional pre-alignment elements 3; movement of the unloading stage 7 to the handover position. release of the first substrate from the transfer assembly 4 on the unloading stage 7, and pickup of the first substrate by the substrate loader fork; and returning of the transfer assembly 4 on the unloading stage 7 to the original position; movement of the loading stage 6 to the handover position 801 and transfer and placement of a second substrate from the substrate loader fork onto the loading stage 6; activation of the X-directional pre-alignment elements 2 on the loading stage 6; movement of the loading stage 6 with the motion tables 102 to the loading Y-directional pre-alignment position 302; transfer of the second substrate to the handover position 802 by the motion table 102 and further transfer of the second substrate to the workpiece stage 5 by the transfer assembly 4 on the loading stage 6; and returning of the transfer assembly 4 on the loading stage 6 to the original position.

It will be appreciated that the foregoing embodiments disclosed herein are described in a progressive manner, with the description of each embodiment focusing on its differences from the others. Reference can be made between the embodiments for a detail description of any feature common to them.

The description presented above is merely that of a few preferred embodiments of the present invention and does not limit the scope thereof in any sense. Any and all changes and modifications made by those of ordinary skill in the art based on the above teachings fall within the scope as defined in the appended claims.

What is claimed is:

1. A substrate transfer device, provided in a photolithography apparatus, and configured to transfer substrates to and receive the substrates from a workpiece stage of the photolithography apparatus, the substrate transfer device comprising a motion platform and one or more transfer stages, the one or more transfer stages are arranged along a first direction and are configured to transfer substrates in a second direction that is perpendicular to the first direction, the motion platform comprising a base table and a motion table in movable connection with the base table, wherein each transfer stage is connected to, and movable in a reciprocating manner in the first direction with, the motion table, wherein a pre-alignment assembly for pre-alignment and positional adjustments of the substrates is provided on the motion platform and on the one or more transfer stages, and wherein the one or more transfer stages comprise at least one loading stage and at least one unloading stage, wherein each loading stage is provided with a transfer assembly configured to transfer a substrate from the loading stage onto the workpiece stage, each unloading stage is provided with a transfer assembly configured to transfer a substrate that has been exposed from the workpiece stage onto the unloading stage,
  wherein the base table defines a substrate handover position, an unloading pre-alignment position and a loading pre-alignment position, wherein when the unloading stage is located at the substrate handover position to transfer an exposed substrate to the workpiece stage, the loading stage is located at the loading pre-alignment position to pre-align a substrate to be exposed, and wherein when the loading stage is located at the substrate handover position to transfer a substrate to be exposed to the workpiece stage, the unloading stage is located at the unloading pre-alignment position to pre-align an exposed substrate.

2. The substrate transfer device of claim 1, wherein the pre-alignment assembly comprises first-directional pre-alignment elements arranged on both sides of the one or more transfer stages and are configured for first-directional pre-alignment and positional adjustments of the substrates on the one or more transfer stages.

3. The substrate transfer device of claim 2, wherein the pre-alignment assembly further comprises second-directional pre-alignment elements arranged on the base table and are configured for second-directional pre-alignment and positional adjustments of the substrates on the one or more transfer stages.

4. The substrate transfer device of claim 3, wherein the one or more transfer stages comprise conveyance roller assemblies and universal adjustment assemblies, the conveyance roller assemblies configured to move a substrate in the second direction, the universal adjustment assemblies adapted to raise the substrate in a third direction and allow first- and/or second-directional position adjustments of the raised substrate, the third direction being perpendicular to a plane defined by the first and second directions.

5. The substrate transfer device of claim 2, wherein the pre-alignment assembly further comprises two second-directional pre-alignment elements located on both sides of the substrate handover position.

6. The substrate transfer device of claim 5, wherein the substrate handover position comprises a substrate loader fork handover position and a workpiece stage handover position which are distributed on both sides of the base table along the second direction, wherein the transfer stage is configured to receive a substrate from a substrate loader fork at the substrate loader fork handover position, and wherein the transfer stage is configured to hand over the substrate onto the workpiece stage at the workpiece stage handover position.

7. The substrate transfer device of claim 6, wherein the base table is provided with a static eliminator configured to eliminate static electricity from a substrate that is being handed over from the substrate loader fork to the loading stage.

8. The substrate transfer device of claim 6, wherein the base table is provided with a safety detection member configured for positional detection of the substrate loader fork for substrate pickup and placement.

9. The substrate transfer device of claim 5, wherein the two second-directional pre-alignment elements are located respectively at the unloading pre-alignment position and the loading pre-alignment position, the unloading pre-alignment position and the loading pre-alignment position being distributed on both sides of the substrate handover position in symmetry with each other along the first direction, and wherein when the unloading stage is located at the substrate handover position, the loading stage is located at the loading pre-alignment position.

10. The substrate transfer device of claim 1, wherein the base table is provided with a transition air suspension assembly configured to provide an air suspension support to a substrate located between the workpiece stage and the transfer stage.

11. The substrate transfer device of claim 10, wherein the transition air suspension assembly is provided with a lifting member that is configured to lift the transition air suspension assembly and is connected to the base table.

12. The substrate transfer device of claim 1, wherein the base table is provided with an air-bath unit configured to adjust a temperature of a substrate carried on the loading stage.

13. A substrate transfer method using the substrate transfer device as defined in claim 1, the substrate transfer method comprising a substrate unloading step for transferring a substrate from a workpiece stage onto an unloading stage, the substrate unloading step comprising:
  Step 1) movement of the unloading stage to a substrate handover position;
  Step 2) transfer of a first substrate that has been exposed from the workpiece stage to the unloading stage by a transfer assembly on the unloading stage;
  Step 3) release of the first substrate by the transfer assembly on the unloading stage and first-directional orientation adjustments of the first substrate on the unloading stage using first-directional pre-alignment elements on the unloading stage;
  Step 4) retention of the first substrate by the transfer assembly on the unloading stage, movement of the unloading stage with the motion table to an unloading pre-alignment position, release of the first substrate by the transfer assembly on the unloading stage, second-directional orientation adjustments of the first substrate on the unloading stage using second-directional pre-alignment elements, and retention of the first substrate by the transfer assembly on the unloading stage, wherein a direction of the first-directional orientation adjustments is perpendicular to a direction of the second-directional orientation adjustments; and
  Step 5) movement of the unloading stage to a substrate loader fork handover position, release of the first substrate by the transfer assembly on the unloading stage, and pickup of the first substrate by a substrate loader fork.

14. The substrate transfer method of claim 13, further comprising Step 6) returning the transfer assembly on the unloading stage to an original position for a next unloading cycle.

15. The substrate transfer method of claim 13, further comprising a substrate loading step for transferring a substrate from a loading stage to the workpiece stage, the substrate loading step comprising:
  Step A) movement of the loading stage to the substrate loader fork handover position and placement of a second substrate onto the loading stage by the substrate loader fork;
  Step B) first-directional orientation adjustments of the second substrate on the loading stage using the first-directional pre-alignment elements on the loading stage;
  Step C) retention of the second substrate by the transfer assembly on the loading stage, movement of the loading stage with the motion table to a loading pre-alignment position, release of the second substrate by the transfer assembly on the loading stage, and second-directional orientation adjustments of the second substrate on the loading stage with using the second-directional pre-alignment elements; and Step D) retention of the second substrate by the transfer assembly on the loading stage, movement of the second substrate with the motion table to a workpiece stage handover position, and transfer of the second substrate onto the workpiece stage by the transfer assembly on the loading stage.

16. The substrate transfer method of claim 15, further comprising Step E) returning the transfer assembly on the loading stage to an original position for a next loading cycle.

17. The substrate transfer method of claim 15, wherein, in Step A), during the transfer of the second substrate by the substrate loader fork, a static eliminator eliminates static electricity from the second substrate.

18. The substrate transfer method of claim 15, wherein, in Step A), during the transfer of the second substrate by the substrate loader fork, a safety detection member detects whether the substrate loader fork is located to interfere with the substrate handover position.

19. The substrate transfer method of claim 15, wherein, in Step C), after completion of the second-directional orientation adjustments of the second substrate, an air-bath unit adjusts a temperature of the second substrate to an ambient temperature for exposure.

20. The substrate transfer method of claim 15, wherein during the first- or second-directional orientation adjustments of the first or second substrate, universal adjustment assemblies on the unloading or loading stage raise the first or second substrate along a third direction that is perpendicular to a plane defined by the first and second directions.

21. The substrate transfer method of claim 13, wherein, in Step 2), prior to the transfer of the first substrate onto the unloading stage, a transition air suspension assembly is lifted by a lifting member so as to provide an air suspension support to the first substrate, and after the first substrate has been transferred onto the unloading stage, the transition air suspension assembly is lowered.

22. A photolithography apparatus, comprising a workpiece stage, wherein the photolithography apparatus further comprises the substrate transfer device as defined in claim 1, in which one or more transfer stages for transferring substrates in a second direction comprises at least one loading stage and at least one unloading stage, the loading stage configured to transfer a substrate to be exposed onto a workpiece stage, the unloading stage configured to receive from the workpiece stage a substrate that has been exposed.

* * * * *